United States Patent
Li

(10) Patent No.: US 12,279,470 B2
(45) Date of Patent: Apr. 15, 2025

(54) ELECTROLUMINESCENT DEVICE, DISPLAY SUBSTRATE, AND DISPLAY APPARATUS

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 401 days.

(21) Appl. No.: 17/764,425

(22) PCT Filed: May 12, 2021

(86) PCT No.: PCT/CN2021/093301
§ 371 (c)(1),
(2) Date: Mar. 28, 2022

(87) PCT Pub. No.: WO2021/254038
PCT Pub. Date: Dec. 23, 2021

(65) Prior Publication Data
US 2022/0344604 A1 Oct. 27, 2022

(30) Foreign Application Priority Data
Jun. 17, 2020 (CN) .......................... 20201055558.1

(51) Int. Cl.
*H01L 51/50* (2006.01)
*H01L 51/56* (2006.01)
(Continued)

(52) U.S. Cl.
CPC .............. *H10K 50/00* (2023.02); *H10K 50/11* (2023.02); *H10K 50/115* (2023.02); *H10K 71/00* (2023.02); *H10K 85/322* (2023.02); *H10K 85/342* (2023.02); *H10K 85/344* (2023.02); *H10K 85/371* (2023.02); *H10K 2101/30* (2023.02); *H10K 2101/40* (2023.02)

(58) Field of Classification Search
None
See application file for complete search history.

(56) References Cited

U.S. PATENT DOCUMENTS

2018/0372637 A1  12/2018  He et al.
2020/0044174 A1   2/2020  Li

FOREIGN PATENT DOCUMENTS

CN   108933201 A   12/2018
CN   108963098 A   12/2018
(Continued)

OTHER PUBLICATIONS

CN202010555558.1 first office action.

*Primary Examiner* — Asok K Sarkar
(74) *Attorney, Agent, or Firm* — IPro, PLLC

(57) ABSTRACT

An electroluminescent device, a display substrate, and a display apparatus. The electroluminescent device comprises: an electron transport layer (1) and a quantum dot light emitting layer (3) that are arranged in a stack mode; and an ionic complex layer (2) located between the electron transport layer (1) and the quantum dot light emitting layer (3), wherein a built-in electric field is formed in the ionic complex layer (2).

14 Claims, 17 Drawing Sheets

(51) Int. Cl.
  *H10K 50/00* (2023.01)
  *H10K 50/11* (2023.01)
  *H10K 50/115* (2023.01)
  *H10K 71/00* (2023.01)
  *H10K 85/30* (2023.01)
  *H10K 101/30* (2023.01)
  *H10K 101/40* (2023.01)

(56) References Cited

FOREIGN PATENT DOCUMENTS

| | | |
|---|---|---|
| CN | 109427939 A | 3/2019 |
| CN | 110299456 A | 10/2019 |
| CN | 110718637 A | 1/2020 |
| CN | 111244308 A | 6/2020 |
| WO | 2020099826 A1 | 5/2020 |

ELECTROLUMINESCENT DEVICE, DISPLAY SUBSTRATE, AND DISPLAY APPARATUS

CROSS REFERENCE TO RELATED APPLICATIONS

The present application is a National Stage of International Application No. PCT/CN2021/093301, filed on May 12, 2021, which claims priority to Chinese Patent Application No. 202010555558.1, filed to the China Patent Office on Jun. 17, 2020, the entire contents of which are incorporated herein by reference.

FIELD

The present disclosure relates to the field of display technology, in particular to an electroluminescent device, a display substrate, and a display apparatus.

BACKGROUND

Quantum Dots (QDs), as a novel luminescent material, have the advantages of high light color purity, high luminous quantum efficiency, adjustable luminous color, long service life, etc., and have become a current research hotspot of luminescent materials in novel light emitting diodes. Therefore, quantum dot light emitting diodes (QLEDs) using quantum dot materials as a light emitting layer have become a current main research direction of novel display devices.

SUMMARY

An electroluminescent device provided by an embodiment of the present disclosure includes: an electron transport layer and a quantum dot light emitting layer that are stacked; and an ionic complex layer between the electron transport layer and the quantum dot light emitting layer, wherein a built-in electric field is in the ionic complex layer.

Optionally, the electroluminescent device provided by the embodiment of the present disclosure, is provided with an inverted structure and further includes: a base substrate on a side of the electron transport layer away from the quantum dot light emitting layer, a cathode between the base substrate and the electron transport layer, and a hole transport layer, a hole injection layer and an anode that are sequentially stacked on a side of the quantum dot light emitting layer away from the base substrate; wherein the ionic complex layer is an independent film layer between the electron transport layer and the quantum dot light emitting layer, one side of the built-in electric field close to the electron transport layer is a negative electrode, and another side of the built-in electric field close to the quantum dot light emitting layer is a positive electrode.

Optionally, in the electroluminescent device provided by the embodiment of the present disclosure, the quantum dot light emitting layer includes a quantum dot, a ligand and a charge balance ion, wherein a group at one end, close to the quantum dot, of the ligand is connected with the quantum dot, a group at another end, away from the quantum dot, of the ligand is an ionic complex of the ionic complex layer, and the ionic complex has charges with opposite polarity to chargers in the charge balance ion.

Optionally, the electroluminescent device provided by the embodiment of the present disclosure, is provided with an inverted structure and further includes: a base substrate on a side of the electron transport layer away from the quantum dot light emitting layer, a cathode between the base substrate and the electron transport layer, and a hole transport layer, a hole injection layer and an anode that are sequentially stacked on a side of the quantum dot light emitting layer away from the base substrate; wherein the built-in electric field includes a first electric field between the electron transport layer and the quantum dot light emitting layer, and a second electric field between the hole transport layer and the quantum dot light emitting layer; a side of the first electric field close to the electron transport layer is a negative electrode, and a side of the first electric field close to the quantum dot light emitting layer is a positive electrode; and a side of the second electric field close to the hole transport layer is a negative electrode, and a side of the second electric field close to the quantum dot light emitting layer is a positive electrode.

Optionally, the above electroluminescent device provided by the embodiment of the present disclosure is provided with an upright structure and further includes: a base substrate on a side of the quantum dot light emitting layer away from the electron transport layer, an anode, a hole injection layer and a hole transport layer that are sequentially stacked between the base substrate and the quantum dot light emitting layer, and a cathode on a side of the electron transport layer away from the base substrate; wherein the built-in electric field includes a third electric field between the hole transport layer and the quantum dot light emitting layer, and a fourth electric field between the electron transport layer and the quantum dot light emitting layer, a side of the third electric field close to the hole transport layer is a positive electrode, and a side thereof close to the quantum dot light emitting layer is a negative electrode; and a side of the fourth electric field close to the electron transport layer is a positive electrode, and a side thereof close to the quantum dot light emitting layer is a negative electrode.

Optionally, in the above electroluminescent device provided by the embodiment of the present disclosure, a material of the ionic complex layer is an organic metal complex.

Optionally, in the above electroluminescent device provided by the embodiment of the present disclosure, the ionic complex layer includes a cation moiety and an anion moiety; wherein the cation moiety includes a central metal ion and a ligand of the central metal ion, the central metal ion includes one of Ir, La, Nd, Eu, Cu, In, Pb or Pt, and the ligand of the central metal ion includes one of o-phenanthroline, 2-phenylpyridine, phenyloxadiazolepyridine, fluorophenylpyridine or bipyridine; and the anion moiety includes one of tetrakis(pentafluorophenyl)boronic acid, tetrakis[(trifluoromethyl)phenyl]boronic acid, tetrakis[bis(trifluoromethyl)phenyl]boronic acid, hexa(pentafluorophenyl)phosphoric acid, hexa[(trifluoromethyl)phenyl]phosphoric acid or hexa[bis(trifluoromethyl)phenyl]phosphoric acid.

Optionally, in the above electroluminescent device provided by the embodiment of the present disclosure, the charge balance ion includes a positive charge balance ion and a negative charge balance ion; the positive charge balance ion includes the cation moiety, $NH_4^+$ or $Na^+$, and the negative charge balance ion includes the anion moiety, $Cl^-$ or $PF^{6-}$.

Correspondingly, an embodiment of the present disclosure further provides a display substrate, including the above electroluminescent device provided by the embodiment of the present disclosure.

Correspondingly, an embodiment of the present disclosure further provides a display apparatus, including a display panel. The display panel includes the above display substrate provided by the embodiment of the present disclosure.

Correspondingly, an embodiment of the present disclosure further provides a method for manufacturing an electroluminescent device, including forming the electron transport layer and the quantum dot light emitting layer that are stacked, and forming the ionic complex layer between the electron transport layer and the quantum dot light emitting layer; wherein a built-in electric field is formed in the ionic complex layer.

Optionally, the above method provided by the embodiment of the present disclosure includes: forming a cathode, the electron transport layer, the ionic complex layer which is independent, the quantum dot light emitting layer, a hole transport layer, a hole injection layer and an anode sequentially on a base substrate; wherein the forming the ionic complex layer includes: depositing a layer of an ionic complex thin film on the electron transport layer through a spin-coating or evaporation process; applying an external electric field in a deposition process, aligning anions and cations inside the ionic complex thin film in an orientation through the external electric field to form the built-in electric field inside the ionic complex thin film, wherein the anions gathering on a side of the built-in electric field close to the electron transport layer forms a negative electrode and the cations gathering on a side of the built-in electric field close to the quantum dot light emitting layer forms a positive electrode; and roasting the ionic complex thin film through a roasting process by continuously applying the external electric field or after removing the external electric field, so as to form the ionic complex layer.

Optionally, the above method provided by the embodiment of the present disclosure includes: forming a cathode, the electron transport layer, the ionic complex layer which is independent, the quantum dot light emitting layer, a hole transport layer, a hole injection layer and an anode sequentially on a base substrate; wherein the forming the ionic complex layer includes: depositing a layer of an ionic complex thin film on the electron transport layer through a spin-coating or evaporation process; and roasting the ionic complex thin film through a roasting process, applying an external electric field in the roasting process, aligning anions and cations inside the ionic complex thin film in an orientation through the external electric field to form the built-in electric field inside the ionic complex thin film, so as to form the ionic complex layer, wherein the anions gathering on a side of the built-in electric field close to the electron transport layer forms a negative electrode and the cations gathering on a side thereof close to the quantum dot light emitting layer forms a positive electrode.

Optionally, the above method provided by the embodiment of the present disclosure includes: forming a cathode and the electron transport layer sequentially on a base substrate; forming a quantum dot mixed solution with an ionic complex, a quantum dot, a ligand, and a charge balance ion on the electron transport layer through a spin-coating or inkjet printing process, wherein a group at one end, close to the quantum dot, of the ligand is connected with the quantum dot, a group at another end, away from the quantum dot, of the ligand is an ionic complex, and the ionic complex has charges with opposite polarity to chargers in the charge balance ion; solidifying the quantum dot mixed solution to form the quantum dot light emitting layer; and forming a hole transport layer and a hole injection layer sequentially on the quantum dot light emitting layer; wherein a first electric field is provided between the electron transport layer and the quantum dot light emitting layer, a side of the first electric field close to the electron transport layer is a negative electrode, and a side of the first electric field close to the quantum dot light emitting layer is a positive electrode; and a second electric field is provided between the hole transport layer and the quantum dot light emitting layer, and a side of the second electric field close to the hole transport layer is a negative electrode, and a side of the second electric field close to the quantum dot light emitting layer is a positive electrode.

Optionally, the above method provided by the embodiment of the present disclosure includes: forming an anode, a hole injection layer and a hole transport layer sequentially on a base substrate; forming a quantum dot mixed solution with an ionic complex, a quantum dot, a ligand, and a charge balance ion on the hole transport layer through a spin-coating or inkjet printing process, wherein a group at one end, close to the quantum dot, of the ligand is connected with the quantum dot, a group at another end, away from the quantum dot, of the ligand is an ionic complex, and the ionic complex has charges with opposite polarity to chargers in the charge balance ion; solidifying the quantum dot mixed solution to form the quantum dot light emitting layer; and forming the electron transport layer and a cathode sequentially on the quantum dot light emitting layer; wherein a third electric field is provided between the hole transport layer and the quantum dot light emitting layer, a side of the third electric field close to the hole transport layer is a positive electrode, and a side of the third electric field close to the quantum dot light emitting layer is a negative electrode; and a fourth electric field is provided between the electron transport layer and the quantum dot light emitting layer, a side of the fourth electric field close to the electron transport layer is a positive electrode, and a side of the fourth electric field close to the quantum dot light emitting layer is a negative electrode.

DETAILED DESCRIPTION OF THE EMBODIMENTS

Figure 1A:
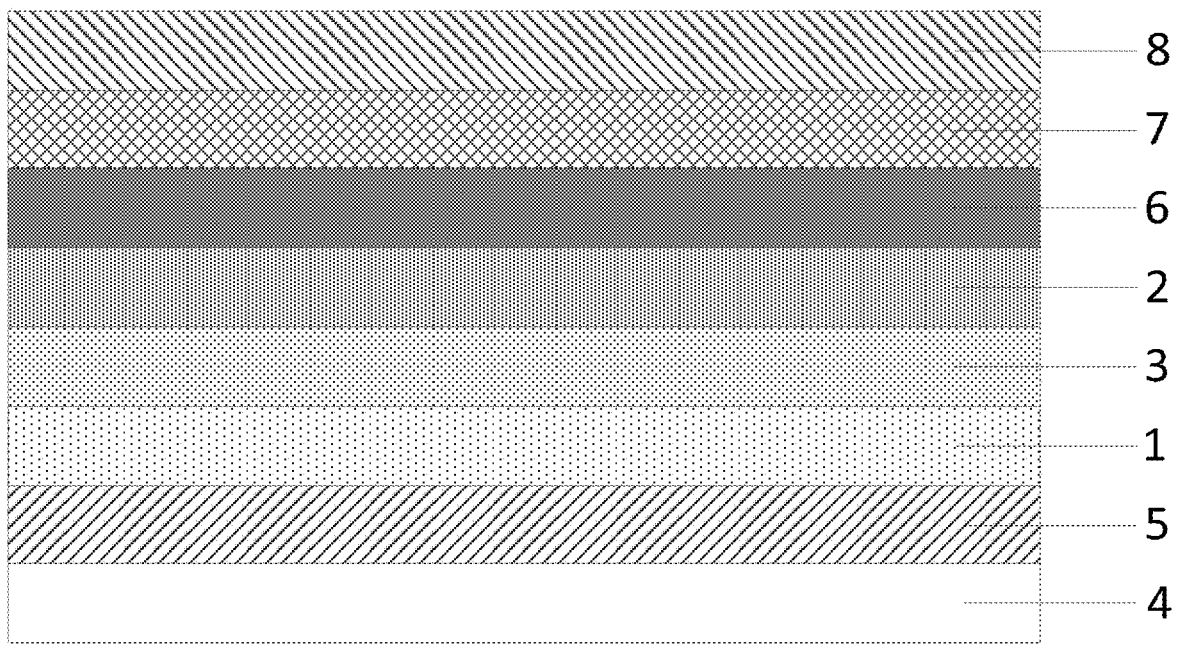
FIG. 1A is a schematic structural diagram of an electroluminescent device provided by an embodiment of the present disclosure.

In order to make objectives, technical solutions and advantages of embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, rather than all the embodiments. Further, the embodiments of the present disclosure and features of the embodiments may be combined with each other under a condition of no conflict. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which this present disclosure belongs. Similar words such as "comprise" or "include" used in the present disclosure mean that elements or items appearing before the words encompass elements or items recited after the words and their equivalents, but do not exclude other elements or items. Words like "connected" or "linked" are not limited to physical or mechanical connections, but may include electrical connections, whether direct or indirect. "Inner", "outer", "upper", "lower", etc. are only used to indicate a relative positional relationship, and when an absolute position of a described object changes, the relative positional relationship may also change accordingly.

It should be noted that dimensions and shapes of figures in the accompanying drawings do not reflect a real scale, and are only intended to illustrate the present disclosure. The same or similar reference numerals refer to the same or similar elements or elements having the same or similar functions throughout.

At present, an active-matrix quantum dot light emitting diode (AMQLED) display product has received more and more extensive attention due to its potential advantages in wide color gamut, long service life, etc. Research thereon is deepening day by day, quantum efficiency is continuously improved, basically reaching an industrialized level, and it has become a future trend to further adopt new processes and technologies to achieve its industrialization. However, in either case of an upright or an inverted device, carrier balance is a factor that affects efficiency of the devices.

Figure 2A:
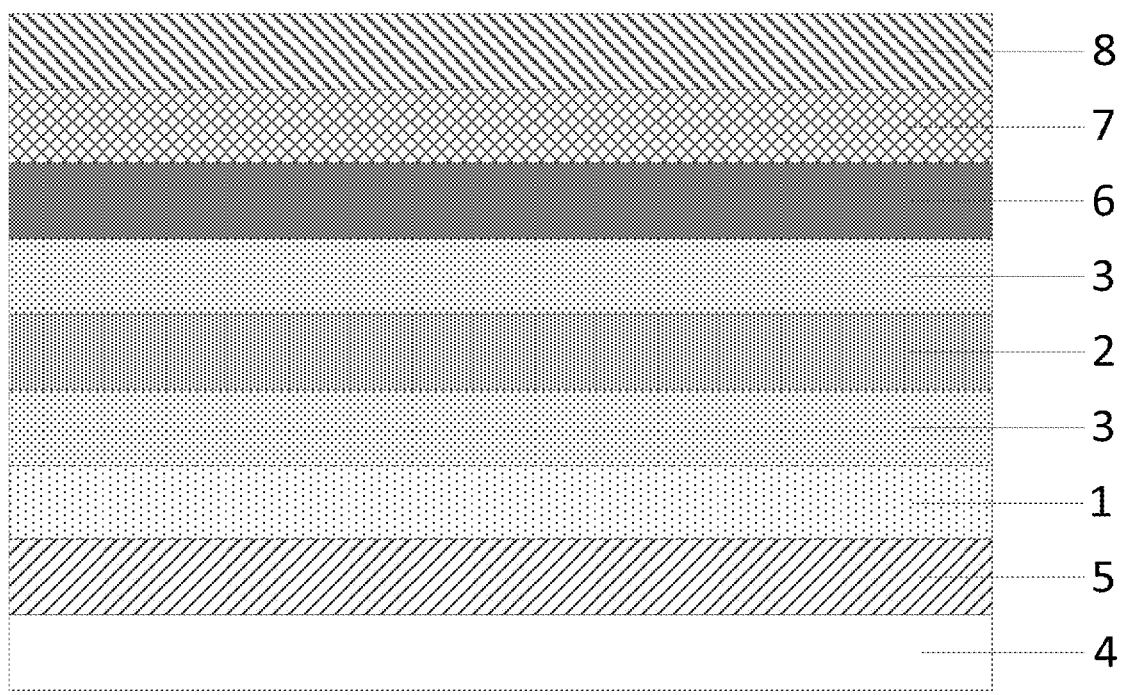
FIG. 2A is a schematic structural diagram of another electroluminescent device provided by an embodiment of the present disclosure.
Figure 3A:
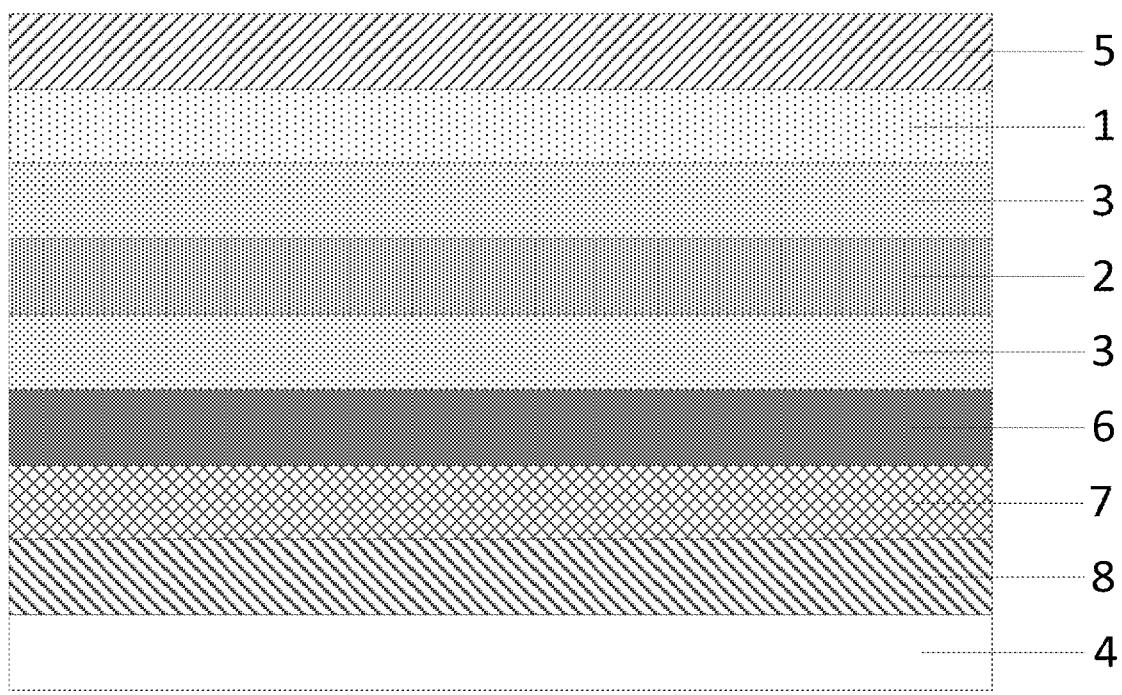
FIG. 3A is a schematic structural diagram of yet another electroluminescent device provided by an embodiment of the present disclosure.

Therefore, in order to solve the problem of carrier balance in an AMQLED display panel, an embodiment of the present disclosure provides an electroluminescent device, as shown in FIG. 1A, FIG. 2A and FIG. 3A, including: an electron transport layer 1 and a quantum dot light emitting layer 2 that are stacked; and an ionic complex layer 3 between the electron transport layer 1 and the quantum dot light emitting layer 2. A built-in electric field is formed in the ionic complex layer 3.

In the above electroluminescent device provided by the embodiment of the present disclosure, the ionic complex layer 3 is between the electron transport layer 1 and the quantum dot light emitting layer 2. Because the built-in electric field is formed in the ionic complex layer 3, by adjusting a direction of the built-in electric field, the built-in electric field may change a vacuum level of an interface between the quantum dot light emitting layer 2 and an adjacent layer, reduce potential energy barriers of energy levels of the quantum dot light emitting layer 2 and the adjacent layer, and improve an efficiency of injecting electrons or holes into the quantum dot light emitting layer 2, thereby improving carrier balance in the quantum dot light emitting layer 2.

In one possible implementation, in the above electroluminescent device provided by the embodiment of the present disclosure, as shown in FIG. 1A, the electroluminescent device is of an inverted structure and further includes: a base substrate 4 on a side of the electron transport layer 1 away from the quantum dot light emitting layer 2, a cathode 5 between the base substrate 4 and the electron transport layer 1, and a hole transport layer 6, a hole injection layer 7 and an anode 8 that are sequentially stacked on a side of the quantum dot light emitting layer 2 away from the base substrate 4.

Figure 1B:
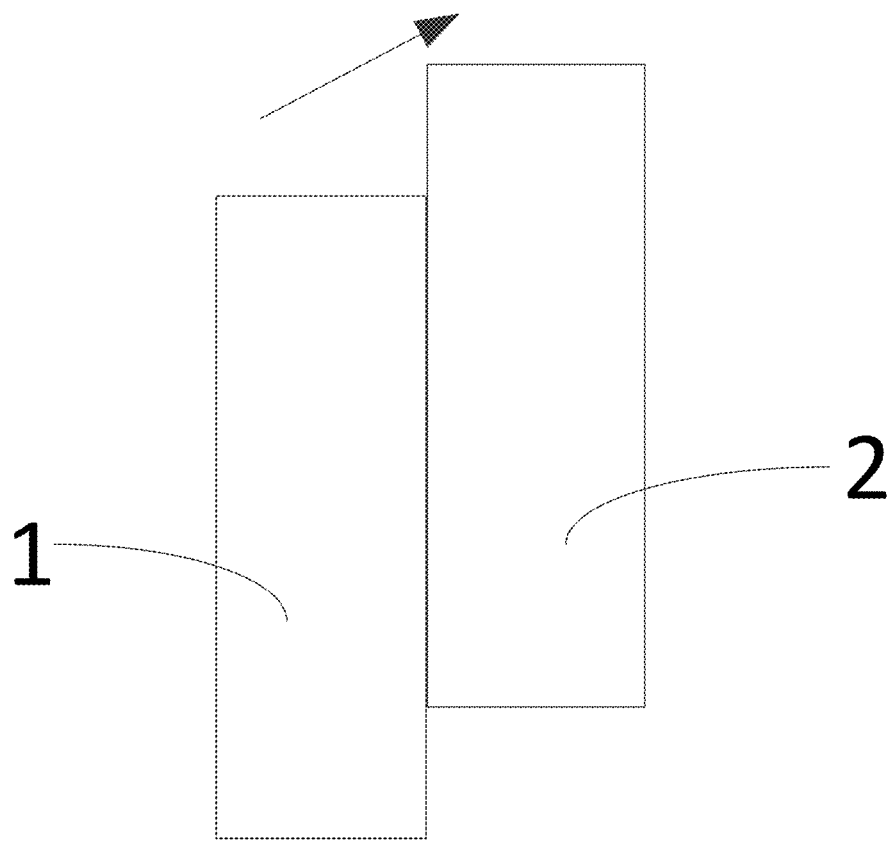
FIG. 1B is a schematic diagram of energy levels of an electron transport layer and a quantum dot light emitting layer in an electroluminescent device in the related art.
Figure 1C:
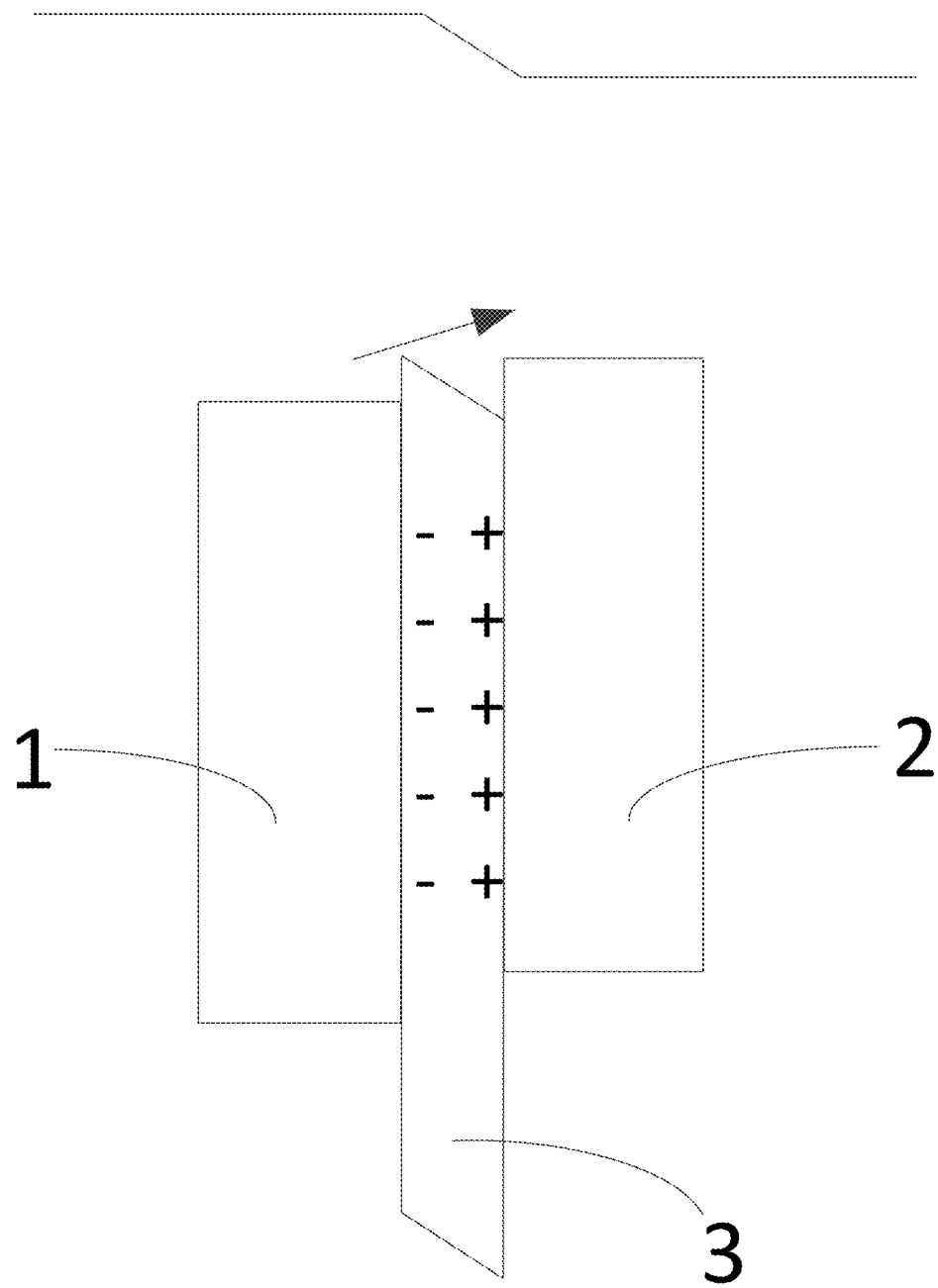
FIG. 1C is a schematic diagram of energy levels of an electron transport layer and a quantum dot light emitting layer in an electroluminescent device provided by an embodiment of the present disclosure.

The ionic complex layer 3 is an independent film layer between the electron transport layer 1 and the quantum dot light emitting layer 2. As shown in FIG. 1C, a side of the built-in electric field E close to the electron transport layer 1 is a negative electrode, and another side thereof close to the quantum dot light emitting layer 2 is a positive electrode.

Because an electron transport layer in an electroluminescent device of an inverted structure is generally made through a sputtering process, a material of the electron transport layer is usually ZnO. Nevertheless, when ZnO is sputtered, because a thin film type ZnO material has a relatively high mobility and a deeper energy level (LUMO (lowest unoccupied molecular orbital) of a ZnO thin film is close to LUMO of a cathode (an ITO material), but is far from LUMO of a quantum dot light emitting layer), it is difficult to inject electrons of the cathode into the quantum dot light emitting layer through ZnO, thus affecting a light emitting efficiency.

However, the ionic complex layer 3 which is independent is between the electron transport layer 1 and the quantum dot light emitting layer 2 in the electroluminescent device of the inverted structure provided by the present disclosure. The ionic complex layer 3 is the independent film layer between the electron transport layer 1 and the quantum dot light emitting layer 2, one side of the built-in electric field E in the ionic complex layer 3 close to the electron transport layer 1 is the negative electrode, and another side of the built-in electric field E close to the quantum dot light emitting layer 2 is the positive electrode, so the built-in electric field may change the vacuum level of the interface between the quantum dot light emitting layer 2 and the electron transport layer 1 and reduce the potential energy barriers of the LUMO energy levels of the quantum dot light emitting layer 2 and the electron transport layer 1. As shown in FIG. 1B and FIG. 1C, the electrons from the electron transport layer 1 injected into the quantum dot light emitting layer 2 may be increased, and carriers in the quantum dot light emitting layer 2 may be balanced, so that the light emitting efficiency of the electroluminescent device is improved, and the and service life of the electroluminescent device is prolonged.

It should be noted that an orbital with the lowest energy level of unoccupied electrons is called a lowest unoccupied molecular orbital, represented by LUMO.

In FIG. 1A, a potential energy barrier of the LUMO energy level of the electron transport layer 1 and a potential energy barrier of the LUMO energy level of the quantum dot light emitting layer 2 may, theoretically, be reduced by about 0.2-0.3 eV from original 0.6-1.0 eV. Of course, specific energy levels are related to the energy levels of the electron transport layer and the quantum dot light emitting layer.

Figure 4A:
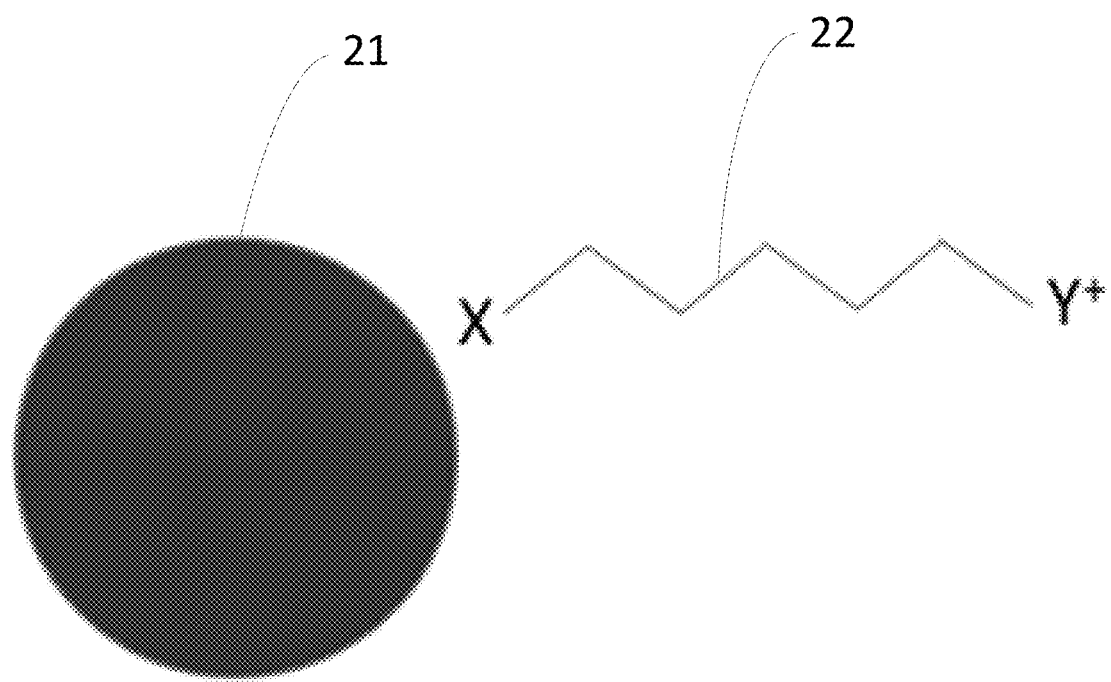
FIG. 4A is a schematic structural diagram of an interior of a quantum dot light emitting layer in FIG. 2A and FIG. 3A.
Figure 4B:
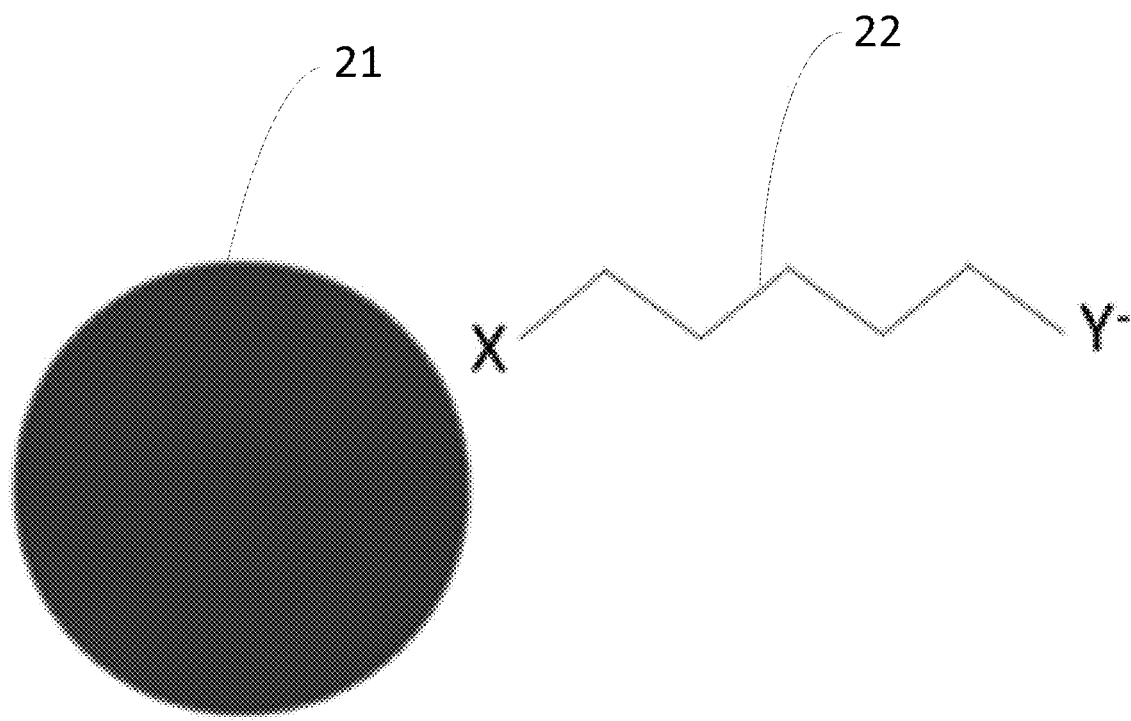
FIG. 4B is another schematic structural diagram of an interior of a quantum dot light emitting layer in FIG. 2A and FIG. 3A.

During specific implementation, in the above electroluminescent device provided by the embodiment of the present disclosure, as shown in FIG. 4A and FIG. 4B, the quantum dot light emitting layer 2 includes a quantum dot 21, a ligand 22 and a charge balance ion (not shown). A group X at one end, close to the quantum dot 21, of the ligand 22 is connected with the quantum dot 21, a group Y at another end, away from the quantum dot 21, of the ligand 22 is an ionic complex (Y) of the ionic complex layer 3, and the ionic complex Y has charges with opposite polarity to chargers in the charge balance ion.

It should be noted that, FIG. 4A is a schematic diagram of the ionic complex (Y) being a cationic complex, FIG. 4B is a schematic diagram of the ionic complex (Y) being an anionic complex, and categories of the ionic complex will be explained in detail below.

As shown in FIG. 4A and FIG. 4B, the quantum dot 21 is usually spherical, ligands 22 are evenly distributed on its spherical surface, and the group at one end, away from the quantum dot 21, of the ligand 22 is the ionic complex Y of the ionic complex layer 3, so it is equivalent to forming the ionic complex Y around the quantum dot 21, i.e. equivalent to forming an ionic complex layer 3 between the quantum dot 21 and the electron transport layer 1 and forming an ionic complex layer 3 between the quantum dot 21 and the hole transport layer. The quantum dot light emitting layer 2 further includes the charge balance ion 23 which has charges with opposite polarity to chargers in the ionic complex Y, and based on a charge balance principle, the ionic complex Y is on a surface close the quantum dot 21 while the charge balance ion 23 is on a surface close to the electron transport layer 1 and a surface close to the hole transport layer, so an electric field formed between the quantum dot light emitting layer 2 and the electron transport layer 1 is provided with a direction opposite to that of an electric field formed between the quantum dot light emitting layer 2 and the hole transport layer. By adjusting the electric fields, the vacuum level of the interface between the quantum dot light emitting layer 2 and the electron transport layer 1 as well as a vacuum level of an interface between the quantum dot light emitting layer 2 and the hole transport layer may be changed, so as to an efficiency of electron or hole injection.

In one possible implementation, as shown in FIG. 2A, the electroluminescent device is of an inverted structure and further includes: the base substrate 4 on a side of the electron transport layer 1 away from the quantum dot light emitting layer 2, a cathode 5 between the base substrate 4 and the electron transport layer 1, and a hole transport layer 6, a hole injection layer 7 and an anode 8 that are sequentially stacked on a side of the quantum dot light emitting layer 2 away from the base substrate 4. It can be seen from the above content that the ionic complex layers 3 are formed between the quantum dot 21 and the electron transport layer 1 and between the quantum dot 21 and the hole transport layer.

Figure 2B:
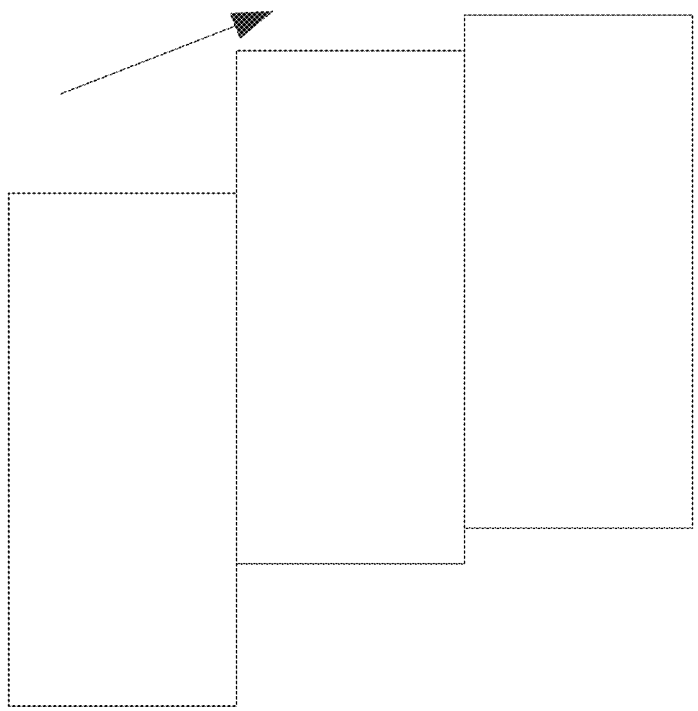
FIG. 2B is a schematic diagram of energy levels of an electron transport layer, a hole transport layer and a quantum dot light emitting layer in an electroluminescent device in the related art.
Figure 2C:
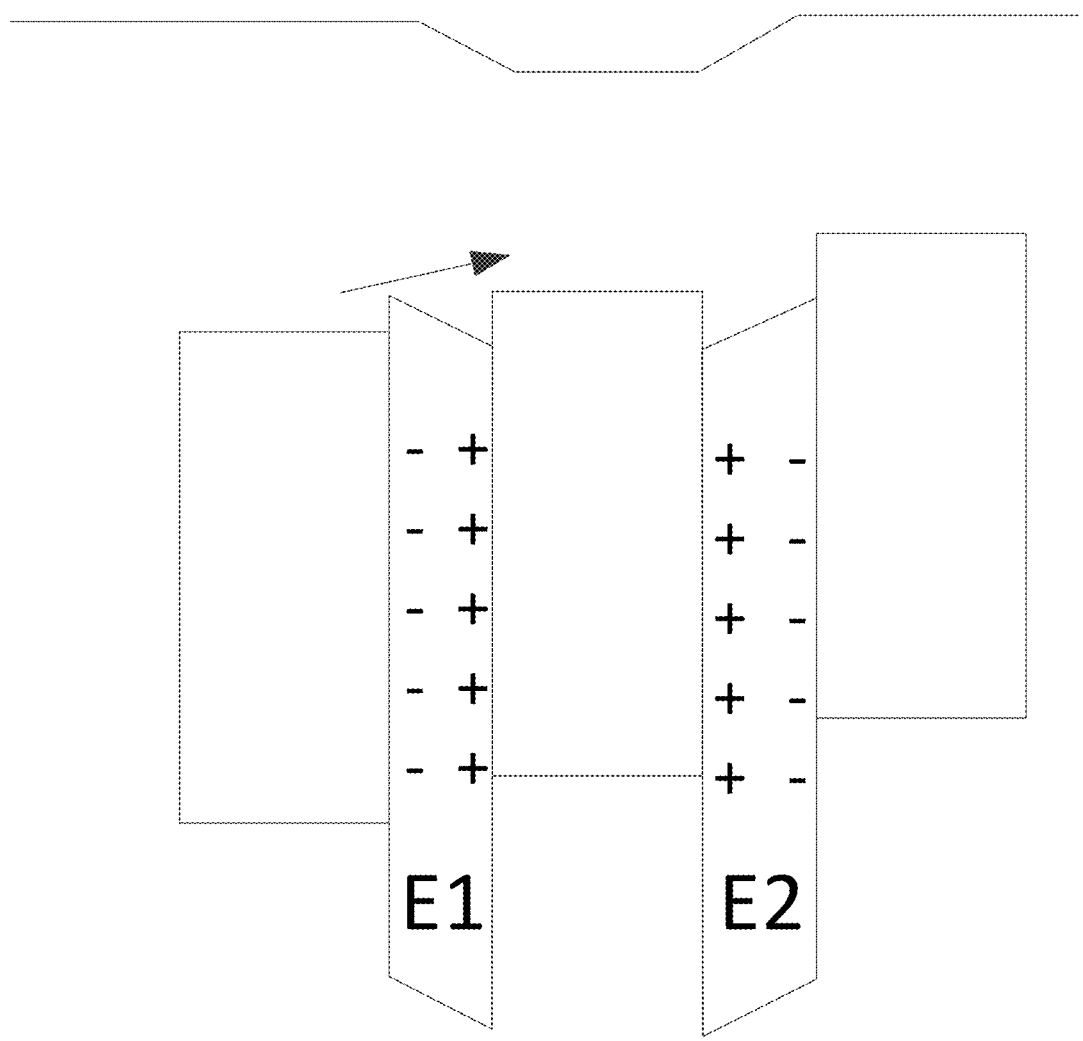
FIG. 2C is a schematic diagram of energy levels of an electron transport layer, a hole transport layer and a quantum dot light emitting layer in an electroluminescent device provided by an embodiment of the present disclosure.

As shown in FIG. 2C, the built-in electric field E includes a first electric field E1 between the electron transport layer 1 and the quantum dot light emitting layer 2, and a second electric field E2 between the hole transport layer 6 and the quantum dot light emitting layer 2.

A side of the first electric field E1 close to the electron transport layer 1 is a negative electrode, and a side of the first electric field E1 close to the quantum dot light emitting layer 2 is a positive electrode.

A side of the second electric field E2 close to the hole transport layer 6 is a negative electrode, and a side of the second electric field E2 close to the quantum dot light emitting layer 2 is a positive electrode.

In the above electroluminescent device of the inverted structure provided by the present disclosure, the ionic complex layer 3 connected with the ligand of the quantum dot is added in the quantum dot light emitting layer 2, and the quantum dot light emitting layer 2 further includes balance ions. Through selecting the balance ions carrying negative charges and the cationic complex, the first electric field E1 may be formed between the quantum dot light emitting layer 2 and the electron transport layer 1 and the second electric field E2 may be formed between the quantum dot light emitting layer 2 and the hole transport layer 6. The side of the first electric field E1 close to the electron transport layer 1 is the negative electrode and the side of the first electric field E1 close to the quantum dot light emitting layer 2 is the positive electrode. Hence, the first electric field E1 may change the vacuum level of the interface between the quantum dot light emitting layer 2 and the electron transport layer 1 and reduce the potential energy barriers of the LUMO energy levels of between the quantum dot light emitting layer 2 and the electron transport layer 1, and the electrons from the electron transport layer 1 injected into the quantum dot light emitting layer 2 may be increased. At the same time, the side of the second electric field E2 close to the hole transport layer 6 is the negative electrode, and the side of the second electric field E2 close to the quantum dot light emitting layer 2 is the positive electrode. Hence, the second electric field E2 may change the vacuum level of the interface between the quantum dot light emitting layer 2 and the hole transport layer 6 and increase potential energy barriers of HOMO energy levels of the two, and holes from the hole transport layer 6 injected into the quantum dot light emitting layer 2 may be decreased. As shown in FIG. 2B and FIG. 2C, in the electroluminescent device of the inverted structure, in general, electron injection is relatively difficult while hole injection is relatively easy. Thereby, by introducing the ionic complex connected with the ligand of the quantum dot in the present disclosure, an electron injection efficiency may be improved while a hole injection efficiency may be lowered, so the carriers in the quantum dot light emitting layer 2 may be effectively balanced, the light emitting efficiency of the electroluminescent device may be improved, and the service life of the electroluminescent device may be prolonged.

In one possible implementation, as shown in FIG. 3A, the electroluminescent device is of an upright structure and further includes: a base substrate 4 on a side of the quantum dot light emitting layer 2 away from the electron transport layer 1, an anode 8, a hole injection layer 7 and a hole transport layer 6 that are sequentially stacked between the base substrate 4 and the quantum dot light emitting layer 2, and a cathode 5 on a side of the electron transport layer 1 away from the base substrate 4.

Figure 3B:
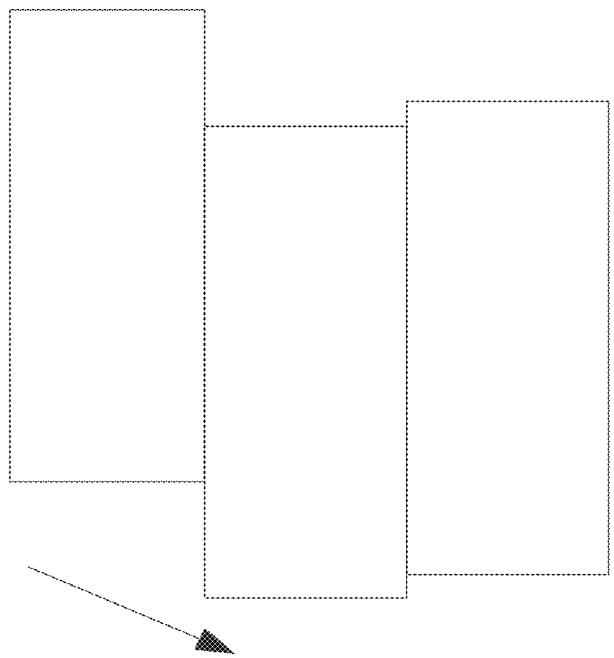
FIG. 3B is a schematic diagram of energy levels of an electron transport layer, a hole transport layer and a quantum dot light emitting layer in an electroluminescent device in the related art.
Figure 3C:
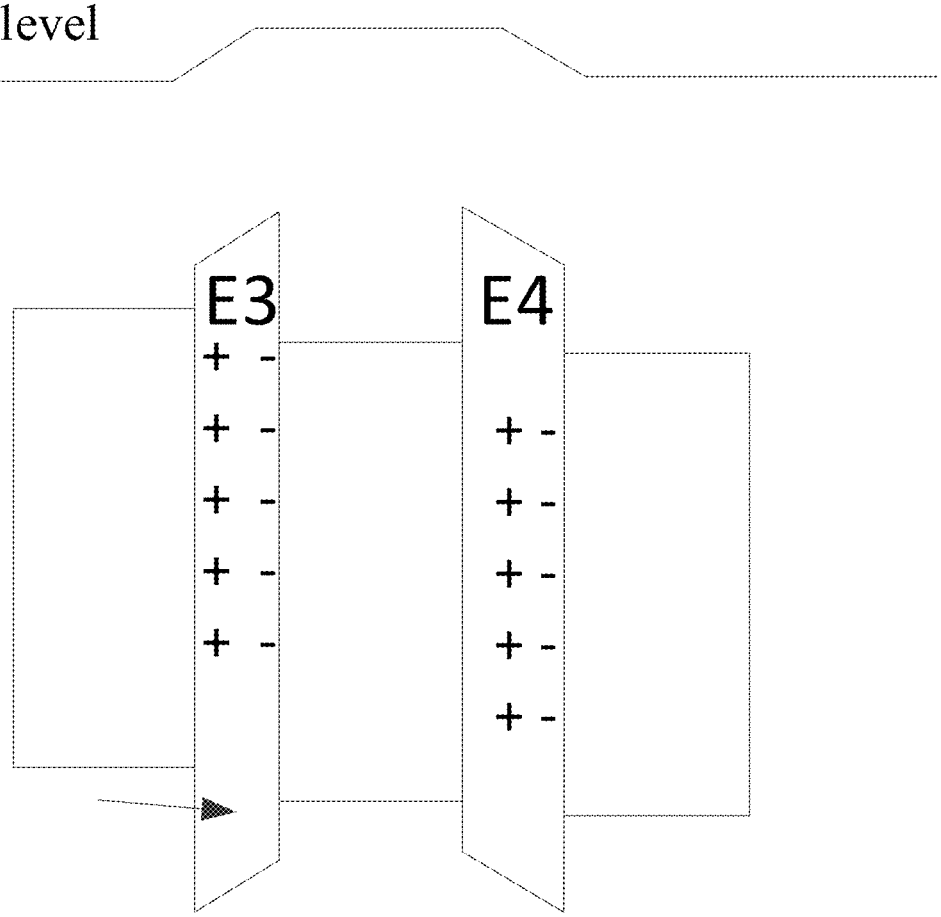
FIG. 3C is a schematic diagram of energy levels of an electron transport layer, a hole transport layer and a quantum dot light emitting layer in an electroluminescent device provided by an embodiment of the present disclosure.

As shown in FIG. 3C, the built-in electric field E includes a third electric field E3 between the hole transport layer 6 and the quantum dot light emitting layer 2, and a fourth electric field E4 between the electron transport layer 1 and the quantum dot light emitting layer 2.

A side of the third electric field E3 close to the hole transport layer 6 is a positive electrode, and a side of the third electric field E3 close to the quantum dot light emitting layer 2 is a negative electrode.

A side of the fourth electric field E4 close to the electron transport layer 1 is a positive electrode, and a side of the fourth electric field E4 close to the quantum dot light emitting layer 2 is a negative electrode.

In the above electroluminescent device of the upright structure provided by the present disclosure, the ionic complex layer 3 connected with the ligand of the quantum dot is added in the quantum dot light emitting layer 2, and the quantum dot light emitting layer 2 further includes the balance ions. Through selecting the balance ions carrying positive charges and the anionic complex, the third electric field E3 may be formed between the quantum dot light emitting layer 2 and the hole transport layer 6 and the fourth electric field E4 may be formed between the quantum dot light emitting layer 2 and the electron transport layer 1. The side of the third electric field E3 close to the hole transport layer 6 is the positive electrode and the side of the third electric field E3 close to the quantum dot light emitting layer 2 is the negative electrode. Hence, the third electric field E3 may change the vacuum level of the interface between the quantum dot light emitting layer 2 and the hole transport layer 6 and reduce the potential energy barriers of the HOMO energy levels of the quantum dot light emitting layer 2 and the hole transport layer 6, and the holes from the hole transport layer 6 injected into the quantum dot light emitting layer 2 may be increased. At the same time, the side of the fourth electric field E4 close to the electron transport layer 1 is the positive electrode, and the side of the fourth electric field E4 close to the quantum dot light emitting layer 2 is the negative electrode. Hence, the fourth electric field E4 may change the vacuum level of the interface between the quantum dot light emitting layer 2 and the electron transport layer 1 and increase potential energy barriers of LUMO energy levels of the quantum dot light emitting layer 2 and the electron transport layer 1, and electrons from the electron transport layer 1 injected into the quantum dot light emitting layer 2 may be decreased. As shown in FIG. 3B and FIG. 3C, in the electroluminescent device of the upright structure, in general, hole injection is relatively difficult while electron injection is relatively easy. Thereby, by introducing the ionic complex connected with the ligand of the quantum dot in the present disclosure, the hole injection efficiency may be improved while an electron injection efficiency may be lowered, so the carriers in the quantum dot light emitting layer 2 may be effectively balanced, the light emitting efficiency of the electroluminescent device may be improved, and the service life of the electroluminescent device may be prolonged.

It should be noted that an orbital with the highest energy level of occupied electrons is called a highest occupied molecular orbital, represented by HOMO.

As shown in FIG. 4A and FIG. 4B, the ligand 22 of the quantum dot light emitting layer is generally an alkyl chain, the group X at the end, close to the quantum dot 21, of the ligand 22 may be some groups, such as —SH, —COOH, —NH2, etc., that may be combined with the quantum dot 21.

During specific implementation, on the basis of the above technical solution, as a preferred implementation, a material of the ionic complex layer is an organic metal complex.

During specific implementation, in the above electroluminescent device provided by the embodiment of the present disclosure, the ionic complex layer includes a cation moiety and an anion moiety.

The cation moiety includes a central metal ion and a ligand of the central metal ion, the central metal ion includes one of Ir, La, Nd, Eu, Cu, In, Pb or Pt, and the ligand of the central metal ion includes one of o-phenanthroline, 2-phenylpyridine, phenyloxadiazolepyridine, fluorophenylpyridine or bipyridine.

The anion moiety includes one of tetrakis(pentafluorophenyl)boronic acid, tetrakis[(trifluoromethyl)phenyl]boronic acid, tetrakis[bis(trifluoromethyl)phenyl]boronic acid, hexa(pentafluorophenyl)phosphoric acid, hexa[(trifluoromethyl)phenyl]phosphoric acid or hexa[bis(trifluoromethyl)phenyl]phosphoric acid.

The cation moiety may be one of the following structures:

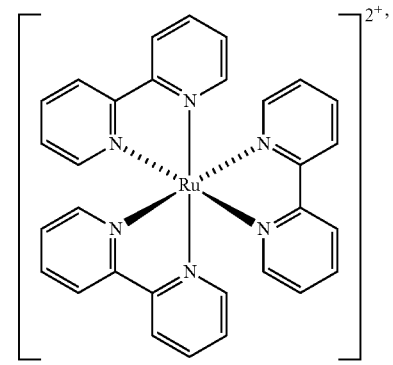

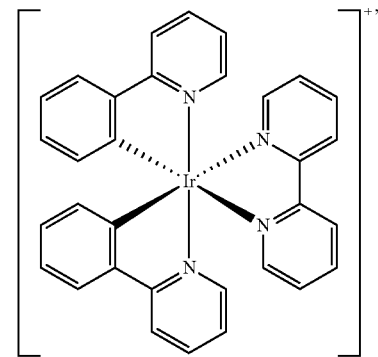

-continued
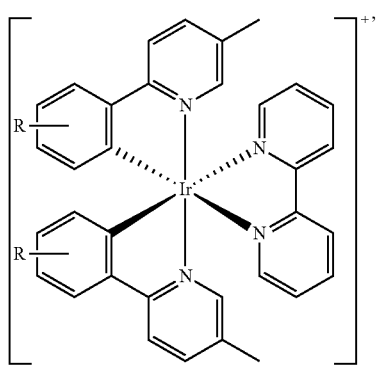
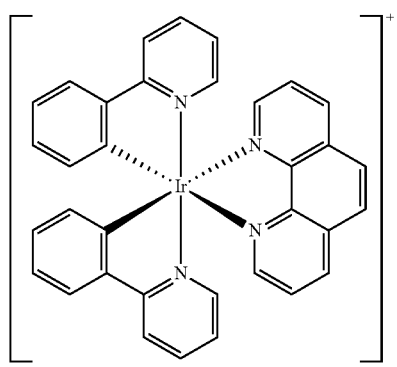
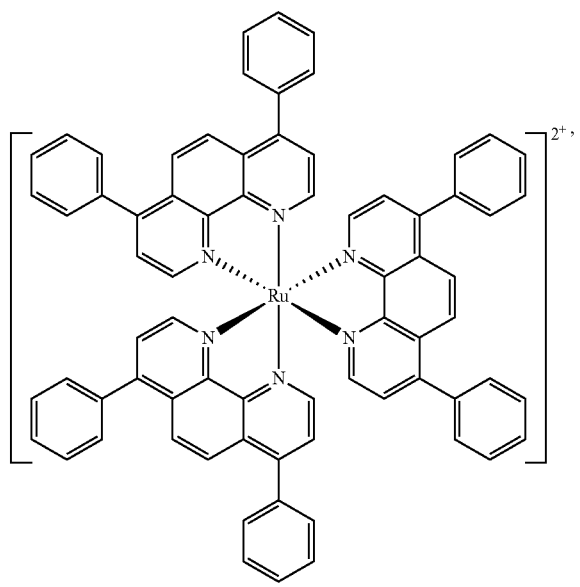
-continued
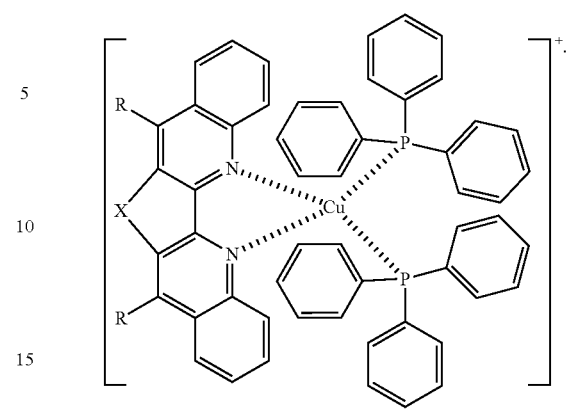
The anion moiety may be one of the following structures:
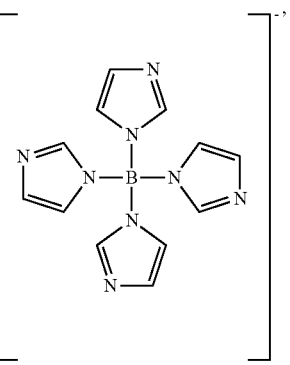
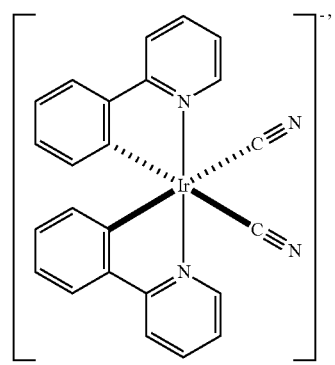
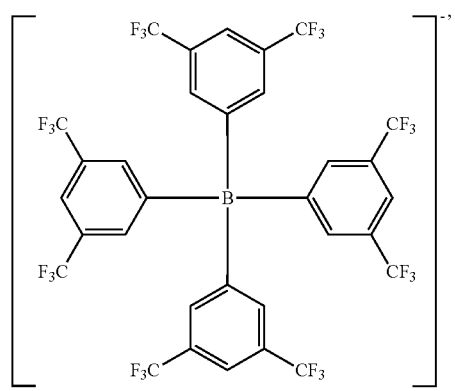

-continued

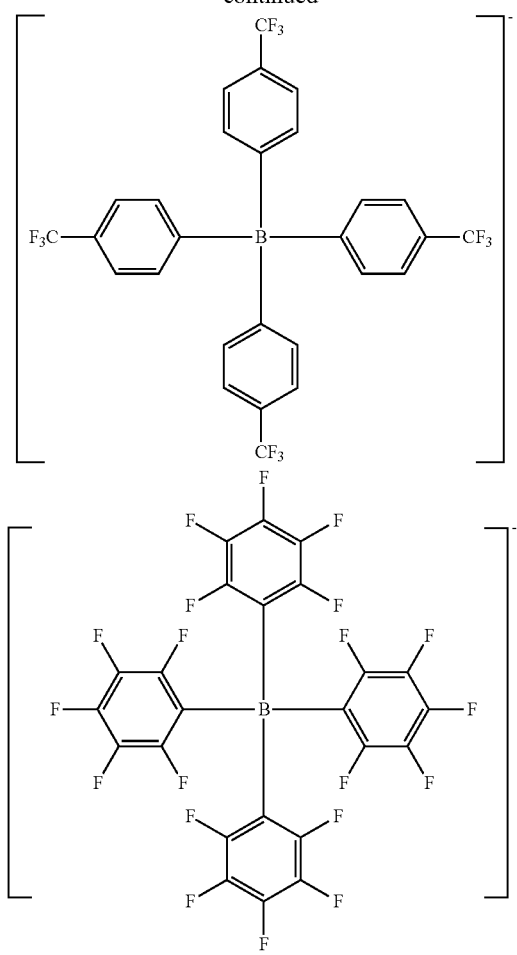

It should be noted that, selected materials of the cation moiety and the anion moiety in FIG. 1A are materials with relatively large space steric hindrance, so anions and cations inside the ionic complex layer shown in FIG. 1A may be aligned in an orientation; and after the external electric field is removed, because of a large steric hindrance effect of the anions and cations themselves, i.e. spatial mutual hindrance, it is difficult to spontaneously restore a disordered arrangement, so an original configuration may be kept unchanged, thereby forming the built-in electric field. The built-in electric field may increase the electrons from the electron transport layer injected into the quantum dot light emitting layer (as shown in FIG. 1C), balance carrier in the quantum dot light emitting layer, and increase the efficiency of the device.

It should be noted that, compared with traditional electrically neutral dipole molecules, in the electroluminescent device provided by the present disclosure, cationic and anionic centers in the ionic complex layer may be designed as ions with different charge quantities as required, and with a larger molecular dipole moment, a stronger internal electric field may be formed.

It should be noted that, in a structure shown in FIG. 1A, the cationic and anionic complexes in the ionic complex layer 3 may be a combination of any above cations and anions.

It should be noted that, selected materials of the cation moiety and the anion moiety in FIG. 2A and FIG. 3A may also be materials with relatively large space steric hindrance.

During specific implementation, in the above electroluminescent device provided by the embodiment of the present disclosure, the charge balance ion includes a positive charge balance ion and a negative charge balance ion. As shown in FIG. 2A, the ionic complex in the quantum dot light emitting layer 2 is the cation moiety, so the negative charge balance ion is selected as the charge balance ion; and as shown in FIG. 3, the ionic complex in the quantum dot light emitting layer 2 is the anion moiety, so the positive charge balance ion is selected as the charge balance ion.

The positive charge balance ion includes the cation moiety, such as $NH_4^+$ or $Na^+$, and the negative charge balance ion includes the anion moiety, such as $Cl^-$ or $PF^{6-}$.

It should be noted that, in a structure shown in FIG. 2A, the ionic complex is the cationic complex, and for the charge balance ion, the anionic complex with large steric hindrance or small molecules such as $Cl^-$ or $PF^{6-}$ may be adopted; and in a structure shown in FIG. 3A, the ionic complex is the anionic complex, and for the charge balance ion, the cationic complex with large steric hindrance or small molecules such as $NH_4^+$ or $Na^+$ may be adopted.

The base substrate in the embodiment of the present disclosure may be a glass or a flexible PET substrate, a material for preparing the anode may be transparent ITO, FTO or a conductive polymer and may also be non-transparent metal electrodes made of Al or Ag. A first choice of a material of the electron transport layer is zinc oxide particles. A material for preparing the hole transport layer may be an organic substance, such as PVK (polyvinyl carbazole), TFB (2,4,4'-trifluorobenzophenone), TPD etc., and may also be an inorganic oxide such as NiOx, VOx, etc. A material for preparing the hole injection layer may be an organic injection material, such as PEDOT: PSS, etc., and may also be an inorganic oxide such as MoOx. A material for preparing the cathode may be a transparent electrode made of ITO, thin Al or Ag, etc., and may also be a non-transparent electrode, such as a thick metal electrode made of Al or Ag.

Based on the same inventive concept, an embodiment of the present disclosure further provides a method for manufacturing an electroluminescent device, including the following.

An electron transport layer and a quantum dot light emitting layer that are stacked are formed, and an ionic complex layer is formed between the electron transport layer and the quantum dot light emitting layer.

A built-in electric field is formed in the ionic complex layer.

In the above method for manufacturing the electroluminescent device provided by the embodiment of the present disclosure, the ionic complex layer is formed between the electron transport layer and the quantum dot light emitting layer. Because the built-in electric field is formed in the ionic complex layer, by adjusting a direction of the built-in electric field, the built-in electric field may change a vacuum level of an interface between the quantum dot light emitting layer and an adjacent layer, reduce potential energy barriers of energy levels of the quantum dot light emitting layer and the adjacent layer, and improve an efficiency of injecting electrons or holes into the quantum dot light emitting layer, thereby improving carrier balance in the quantum dot light emitting layer.

During specific implementation, in the above method provided by the embodiment of the present disclosure, forming the electroluminescent device shown in FIG. 1A may include: a cathode 5, the electron transport layer 1, the ionic complex layer 3 which is independent, the quantum dot light emitting layer 2, a hole transport layer 6, a hole injection layer 7 and an anode 8 are sequentially formed on a base substrate 4.

The forming the ionic complex layer 3 may include: a layer of an ionic complex thin film is deposited on the electron transport layer through a spin-coating or evaporation process.

Figure 5A:
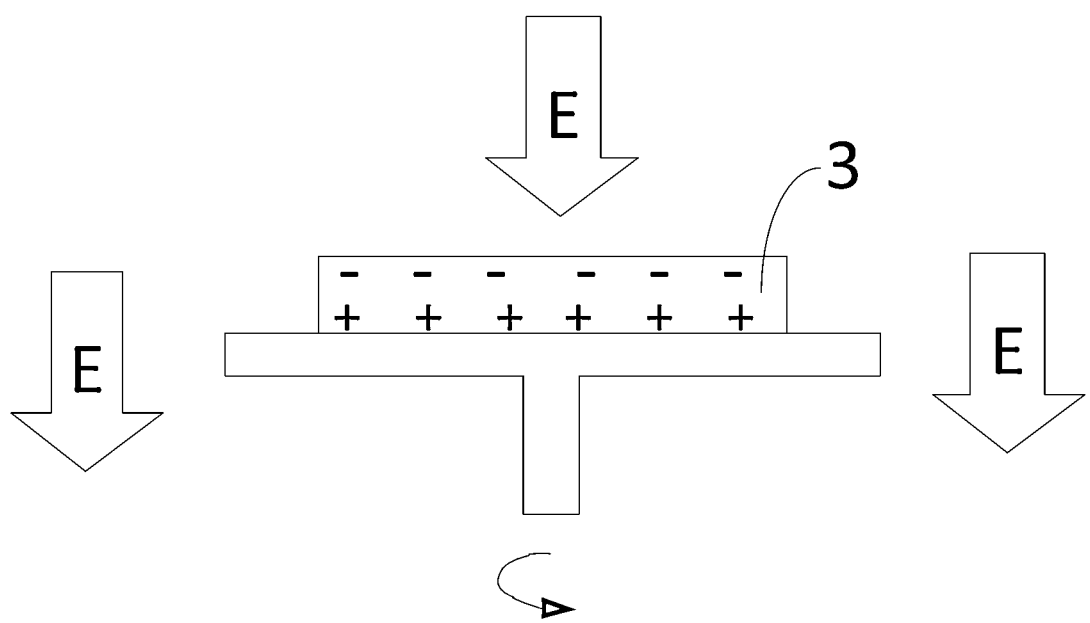
FIG. 5A is a schematic diagram of a spin-coating process in a method for manufacturing an electroluminescent device provided by an embodiment of the present disclosure.
Figure 5B:
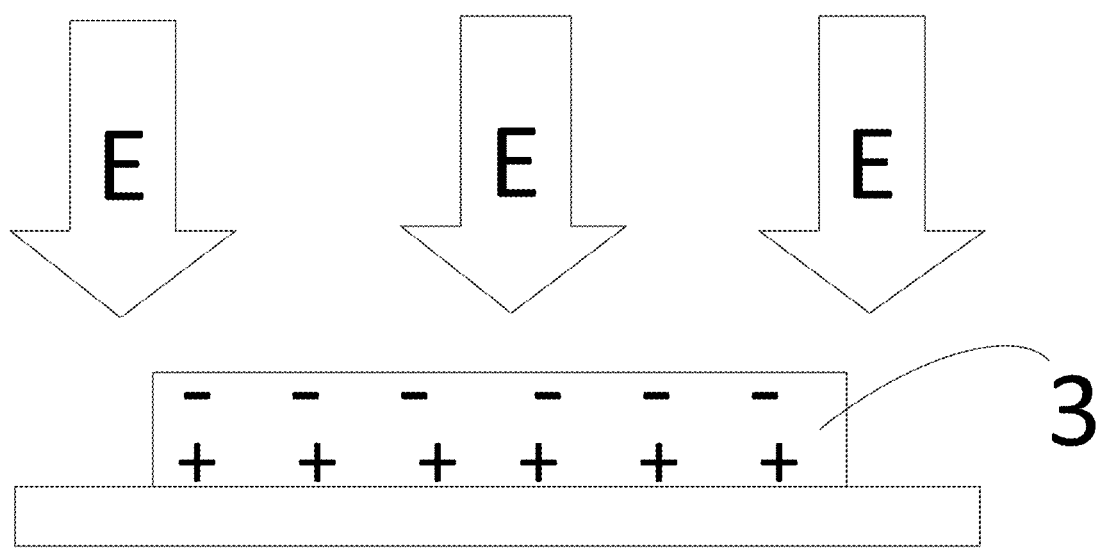
FIG. 5B is a schematic diagram of a roasting process in a method for manufacturing an electroluminescent device provided by an embodiment of the present disclosure.
Figure 5C:
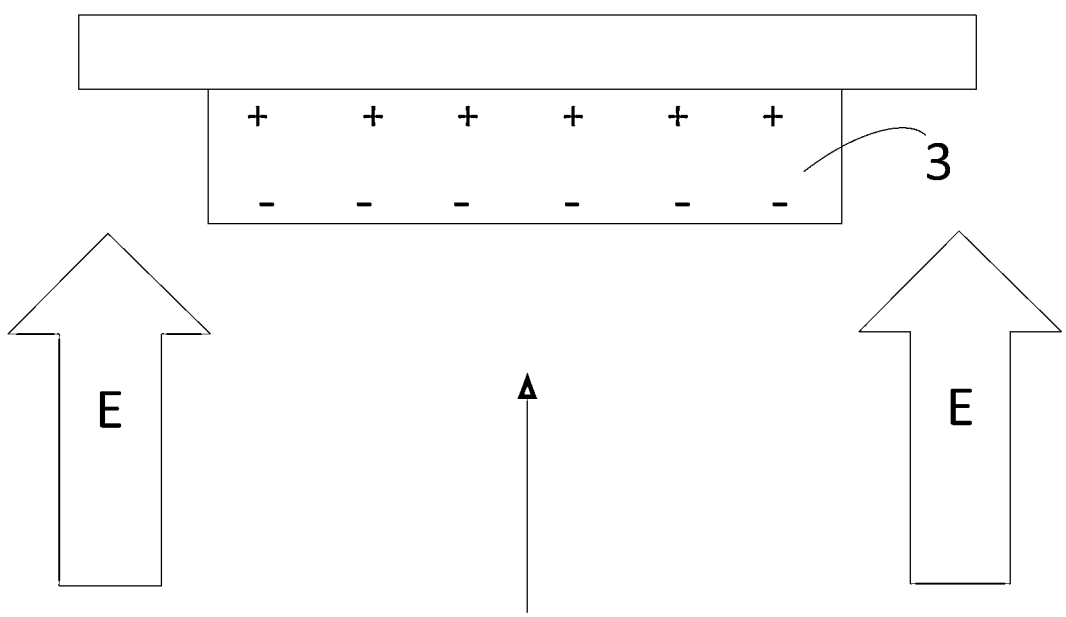
FIG. 5C is a schematic diagram of an evaporation process in a method for manufacturing an electroluminescent device provided by an embodiment of the present disclosure.

As shown in FIG. 5A and FIG. 5C, an external electric field is applied in a deposition process, and anions and cations inside the ionic complex thin film are aligned in an orientation through the external electric field to form the built-in electric field E inside the ionic complex thin film, the anions are enabled to gather on a side of the built-in electric field E close to the electron transport layer 1 to form a negative electrode, and the cations are enabled to gather on a side of the built-in electric field E close to the quantum dot light emitting layer 2 to form a positive electrode.

As shown in FIG. 5B, the ionic complex thin film is roasted through a roasting process by continuously applying the external electric field, so as to form the ionic complex layer 3 which is independent.

That is, to form the ionic complex layer 3 in FIG. 1A, the external electric field may be constantly applied in the deposition and roasting processes.

During specific implementation, in the above method provided by the embodiment of the present disclosure, forming the electroluminescent device shown in FIG. 1A may include: the cathode 5, the electron transport layer 1, the ionic complex layer 3 which is independent, the quantum dot light emitting layer 2, the hole transport layer 6, the hole injection layer 7 and the anode 8 are sequentially formed on the base substrate 4.

The forming the ionic complex layer 3 which is independent may include: the layer of the ionic complex thin film is deposited on the electron transport layer through the spin-coating or evaporation process.

As shown in FIG. 5A and FIG. 5C, the external electric field is applied in the deposition process, and the anions and cations inside the ionic complex thin film are aligned in an orientation through the external electric field so as to form the built-in electric field E inside the ionic complex thin film, the anions are enabled to gather on the side of the built-in electric field E close to the electron transport layer 1 to form the negative electrode, and the cations are enabled to gather on the side of the built-in electric field E close to the quantum dot light emitting layer 2 to form the positive electrode; and the ionic complex thin film is roasted through the roasting process after the external electric field is removed, so as to form the ionic complex layer 3 which is independent.

That is, to form the ionic complex layer 3 which is independent in FIG. 1A, the external electric field may also be applied only in the deposition process.

During specific implementation, in the above method provided by the embodiment of the present disclosure, forming the electroluminescent device shown in FIG. 1A may include: the cathode 5, the electron transport layer 1, the ionic complex layer 3 which is independent, the quantum dot light emitting layer 2, the hole transport layer 6, the hole injection layer 7 and the anode 8 are sequentially formed on the base substrate 4.

The forming the ionic complex layer 3 which is independent may include: the layer of the ionic complex thin film is deposited on the electron transport layer through the spin-coating or evaporation process.

As shown in FIG. 5B, the ionic complex thin film is roasted through the roasting process, the external electric field is applied in the roasting process, and anions and cations inside the ionic complex thin film are aligned in an orientation through the external electric field so as to form the built-in electric field inside the ionic complex thin film E, the anions are enabled to gather on the side of the built-in electric field E close to the electron transport layer 1 to form the negative electrode, and the cations are enabled to gather on the side of the built-in electric field E close to the quantum dot light emitting layer 2 to form the positive electrode, so as to form the ionic complex layer 3 which is independent.

That is, to form the ionic complex layer 3 which is independent in FIG. 1A, the external electric field may also be applied in the roasting process.

Since the base substrate is placed on a stage, a device for spin-coating, evaporation or roasting is also a metal component, so a method for introducing the external electric field may be: taking the evaporation process as an example, a positive electrode and a negative electrode may be respectively connected on a stage of an evaporation source and a stage of the base substrate, and because these components are all metals, an electric field in a certain direction may be formed between the evaporation source and the substrate.

Figure 6:
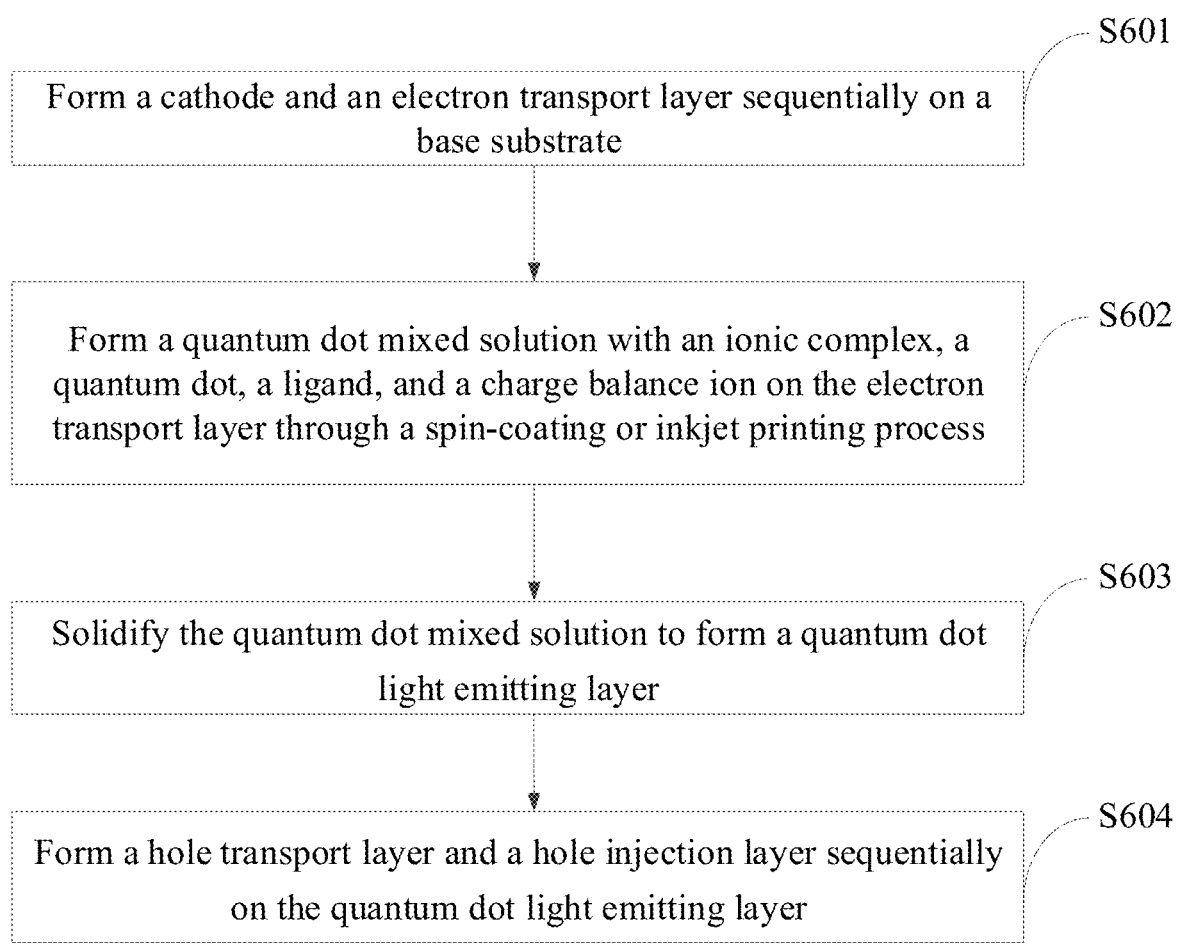
FIG. 6 is a schematic flow diagram of a method for manufacturing an electroluminescent device provided by an embodiment of the present disclosure.

During specific implementation, in the above method provided by the embodiment of the present disclosure, forming the electroluminescent device as shown in FIG. 2A may, as shown in FIG. 6, include the following.

S601, the cathode and the electron transport layer are sequentially formed on the base substrate.

S602, a quantum dot mixed solution with an ionic complex, a quantum dot, a ligand, and a charge balance ion is formed on the electron transport layer through a spin-coating or inkjet printing process, wherein a group at one end, close to the quantum dot, of the ligand is connected with the quantum dot, a group at another end, away from the quantum dot, of the ligand is an ionic complex, and the ionic complex has charges with opposite polarity to chargers in the charge balance ion.

S603, the quantum dot mixed solution is solidified to form the quantum dot light emitting layer.

S604, the hole transport layer and the hole injection layer are sequentially formed on the quantum dot light emitting layer.

As shown in FIG. 2A and FIG. 2C, the first electric field E1 is provided between the electron transport layer 1 and the quantum dot light emitting layer 2, the side of the first electric field E1 close to the electron transport layer 1 is the negative electrode, and the side of the first electric field E1 close to the quantum dot light emitting layer 2 is the positive electrode; and the second electric field E2 is provided between the hole transport layer 6 and the quantum dot light emitting layer 2, and the side of the second electric field E2 close to the hole transport layer 6 is the negative electrode, and the side of the second electric field E2 close to the quantum dot light emitting layer 2 is the positive electrode.

According to the method for manufacturing the electroluminescent device as shown in FIG. 2A provided by the embodiment of the present disclosure, based on a charge balance principle, an ionic complex Y is on a surface close to a quantum dot 21 while a charge balance ion 23 is on a surface close to the electron transport layer 1 and the hole transport layer, so an electric field formed between the quantum dot light emitting layer 2 and the electron transport layer 1 is provided with a direction opposite to that of an electric field formed between the quantum dot light emitting layer 2 and the hole transport layer. That is, through selecting a cationic complex and balance ions carrying negative charges, the first electric field E1 may be formed between the quantum dot light emitting layer 2 and the electron transport layer 1 and the second electric field E2 may be formed between the quantum dot light emitting layer 2 and the hole transport layer 6. The side of the first electric field E1 close to the electron transport layer 1 is the negative electrode and the side thereof close to the quantum dot light emitting layer 2 is the positive electrode. Hence, the first electric field E1 may change a vacuum level of an interface between the quantum dot light emitting layer 2 and the electron transport layer 1 and reduce potential energy barriers of LUMO energy levels of the two, and electrons from the electron transport layer 1 injected into the quantum dot light emitting layer 2 may be increased. At the same time, the side of the second electric field E2 close to the hole transport layer 6 is the negative electrode, and the side thereof close to the quantum dot light emitting layer 2 is the positive electrode. Hence, the second electric field E2 may change a vacuum level of an interface between the quantum dot light emitting layer 2 and the hole transport layer 6 and increase potential energy barriers of HOMO energy levels of the two, and holes from the hole transport layer 6 injected into the quantum dot light emitting layer 2 may be decreased. As shown in FIG. 2B and FIG. 2C, in the electroluminescent device of an inverted structure, in general, electron injection is relatively difficult while hole injection is relatively easy. Thereby, by introducing the ionic complex connected with the ligand of the quantum dot in the present disclosure, the electron injection efficiency may be improved while the hole injection efficiency may be lowered, so carriers in the quantum dot light emitting layer 2 may be effectively balanced, the light emitting efficiency of the electroluminescent device may be improved, and the service life of the electroluminescent device may be prolonged.

Figure 7:
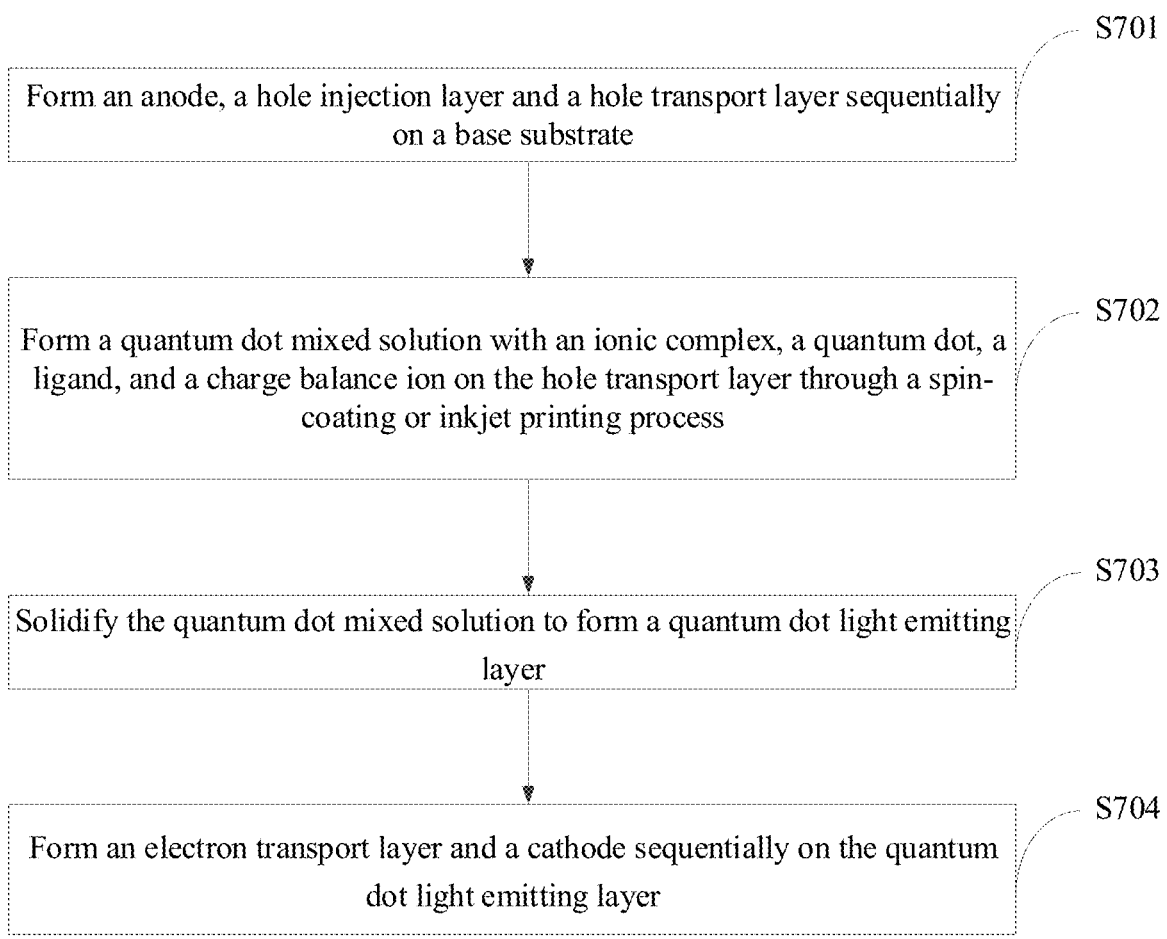
FIG. 7 is a schematic flow diagram of a method for manufacturing another electroluminescent device provided by an embodiment of the present disclosure.

During specific implementation, in the above method provided by the embodiment of the present disclosure, forming the electroluminescent device as shown in FIG. 3A may, as shown in FIG. 7, include the following.

S701, the anode, the hole injection layer and the hole transport layer are sequentially formed on the base substrate.

S702, the quantum dot mixed solution with the ionic complex, the quantum dot, the ligand, and the charge balance ion is formed on the hole transport layer through the spin-coating or inkjet printing process, wherein a group at one end, close to the quantum dot, of the ligand is connected with the quantum dot, a group at another end, away from the quantum dot, of the ligand is an ionic complex, and the ionic complex has charges with opposite polarity to chargers in the charge balance ion.

S703, the quantum dot mixed solution is solidified to form the quantum dot light emitting layer.

S704, the electron transport layer and the cathode are sequentially formed on the quantum dot light emitting layer.

As shown in FIG. 3A and FIG. 3C, a third electric field E3 is provided between the hole transport layer 6 and the quantum dot light emitting layer 2, a side of the third electric field E3 close to the hole transport layer 6 is a positive electrode, and a side of the third electric field E3 close to the quantum dot light emitting layer 2 is a negative electrode; and a fourth electric field E4 is provided between the electron transport layer 1 and the quantum dot light emitting layer 2, a side of the fourth electric field E4 close to the electron transport layer 1 is a positive electrode, and a side of the fourth electric field E4 close to the quantum dot light emitting layer 2 is a negative electrode.

According to the method for manufacturing the electroluminescent device as shown in FIG. 3A provided by the embodiment of the present disclosure, based on the charge balance principle, the ionic complex Y is on a surface close to the quantum dot 21 while the charge balance ion 23 is on a surface close to the electron transport layer 1 and the hole transport layer, so the electric field formed between the quantum dot light emitting layer 2 and the electron transport layer 1 is provided with a direction opposite to that of an electric field formed between the quantum dot light emitting layer 2 and the hole transport layer. That is, through selecting an anionic complex and the balance ions carrying positive charges, the third electric field E3 may be formed between the quantum dot light emitting layer 2 and the hole transport layer 6 and the fourth electric field E4 may be formed between the quantum dot light emitting layer 2 and the electron transport layer 1. The side of the third electric field E3 close to the hole transport layer 6 is the positive electrode and the side thereof close to the quantum dot light emitting layer 2 is the negative electrode. Hence, the third electric field E3 may change the vacuum level of the interface between the quantum dot light emitting layer 2 and the hole transport layer 6 and reduce the potential energy barriers of the HOMO energy levels of the two, and the holes from the hole transport layer 6 injected into the quantum dot light emitting layer 2 may be increased. At the same time, the side of the fourth electric field E4 close to the electron transport layer 1 is the positive electrode, and the side thereof close to the quantum dot light emitting layer 2 is the negative electrode. Hence, the fourth electric field E4 may change the vacuum level of the interface between the quantum dot light emitting layer 2 and the electron transport layer 1 and increase potential energy barriers of LUMO energy levels of the two, and electrons from the electron transport layer 1 injected into the quantum dot light emitting layer 2 may be decreased. As shown in FIG. 3B and FIG. 3C, in the electroluminescent device of the upright structure, in general, hole injection is relatively difficult while electron injection is relatively easy. Thereby, by introducing the ionic complex connected with the ligand of the quantum dot in the present disclosure, the hole injection efficiency may be improved while the electron injection efficiency may be lowered, so the carriers in the quantum dot light emitting layer 2 may be effectively balanced, the light emitting efficiency of the electroluminescent device may be improved, and the service life of the electroluminescent device may be prolonged.

Based on the same inventive concept, an embodiment of the present disclosure further provides a display substrate, including the above electroluminescent device provided by the embodiment of the present disclosure. Because a problem solving principle of the display substrate is similar to that of the aforesaid electroluminescent device, for implementation of the display substrate, reference may be made to implementation of the above electroluminescent device, and repetition will not be made.

Based on the same inventive concept, an embodiment of the present disclosure further provides a display apparatus, including the display panel. The display panel includes the above display substrate provided by the embodiment of the present disclosure. Because a problem solving principle of the display apparatus is similar to that of the aforesaid electroluminescent device, for implementation of the display apparatus, reference may be made to implementation of the above electroluminescent device, and repetition will not be made.

During specific implementation, the above display apparatus provided by the embodiment of the present disclosure may be a full-screen display apparatus, or may also be a flexible display apparatus, etc., which is not limited herein.

Figure 8:
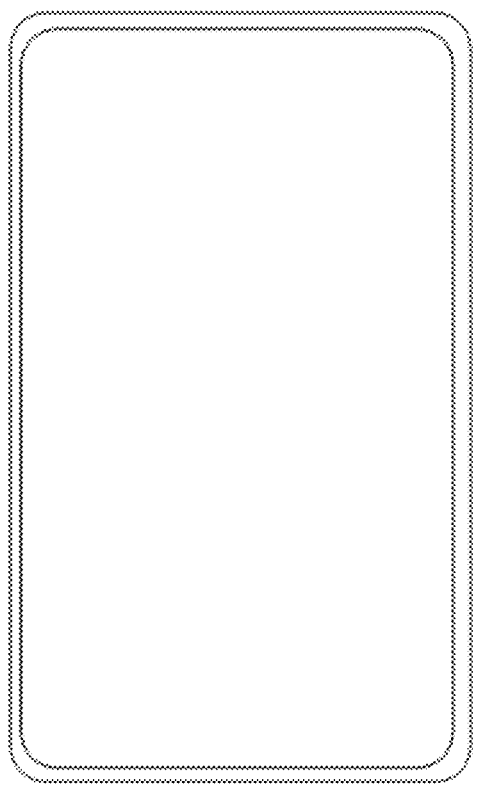
FIG. 8 is a schematic structural diagram of a display apparatus provided by an embodiment of the present disclosure.

During specific implementation, the above display apparatus provided by the embodiment of the present disclosure may be a full-screen mobile phone as shown in FIG. 8. Of course, the above display apparatus provided by the embodiment of the present disclosure may also be any product or component with a display function, such as a tablet computer, a television, a monitor, a notebook computer, a digital photo frame, and a navigator. Other essential components of the display apparatus should be understood by those of ordinary skill in the art, and will not be repeated here, nor should they be regarded as a limitation to the present invention.

According to the above electroluminescent device, the display substrate and the display apparatus provided by embodiments of the present disclosure, the ionic complex layer is between the electron transport layer and the quantum dot light emitting layer. Because the built-in electric field is formed in the ionic complex layer, by adjusting the direction of the built-in electric field, the built-in electric field may change the vacuum level of the interface between the quantum dot light emitting layer and the adjacent layer, reduce the potential energy barriers of the energy levels of the quantum dot light emitting layer and the adjacent layer, and improve the efficiency of injecting the electrons or holes into the quantum dot light emitting layer, thereby improving carrier balance in the quantum dot light emitting layer.

While preferred embodiments of the present disclosure have been described, additional changes and modifications to these embodiments may be made by those of skill in the art once they are aware of basic inventive concepts. Therefore, the appended claims are intended to be construed to include the preferred embodiments and all changes and modifications that fall within the scope of the present disclosure.

Obviously, those of skill in the art can make various changes and modifications to the embodiments of the present disclosure without departing from the spirit and scope of the embodiments of the present disclosure. Thus, provided that these changes and modifications of the embodiments of the present disclosure fall within the scope of the claims of the present disclosure and their equivalents, the present disclosure is also intended to cover such changes and modifications.

What is claimed is:

1. An electroluminescent device, comprising:
   an electron transport layer and a quantum dot light emitting layer that are stacked; and
   an ionic complex layer between the electron transport layer and the quantum dot light emitting layer, wherein a built-in electric field is in the ionic complex layer;
   wherein the quantum dot light emitting layer comprises a quantum dot, a ligand and a charge balance ion;
   wherein a group at one end, close to the quantum dot, of the ligand is connected with the quantum dot, a group, at another end, away from the quantum dot, of the ligand is an ionic complex of the ionic complex layer, and the ionic complex has charges with opposite polarity to chargers in the charge balance ion;
   wherein a material of the ionic complex layer is an organic metal complex.

2. The electroluminescent device according to claim 1, provided with an inverted structure and further comprising:
   a base substrate on a side of the electron transport layer away from the quantum dot light emitting layer;
   a cathode between the base substrate and the electron transport layer; and
   a hole transport layer, a hole injection layer and an anode that are sequentially stacked on a side of the quantum dot light emitting layer away from the base substrate;
   wherein the ionic complex layer is an independent film layer between the electron transport layer and the quantum dot light emitting layer, one side of the built-in electric field close to the electron transport layer is a negative electrode, and another side of the built-in electric field close to the quantum dot light emitting layer is a positive electrode.

3. The electroluminescent device according to claim 1, provided with an inverted structure and further comprising:
   a base substrate on a side of the electron transport layer away from the quantum dot light emitting layer;
   a cathode between the base substrate and the electron transport layer; and
   a hole transport layer, a hole injection layer and an anode that are sequentially stacked on a side of the quantum dot light emitting layer away from the base substrate;
   wherein the built-in electric field comprises a first electric field between the electron transport layer and the quantum dot light emitting layer, and a second electric field between the hole transport layer and the quantum dot light emitting layer;
   a side of the first electric field close to the electron transport layer is a negative electrode, and a side of the first electric field close to the quantum dot light emitting layer is a positive electrode; and
   a side of the second electric field close to the hole transport layer is a negative electrode, and a side of the second electric field close to the quantum dot light emitting layer is a positive electrode.

4. The electroluminescent device according to claim 1, provided with an upright structure and further comprising:
   a base substrate on a side of the quantum dot light emitting layer away from the electron transport layer;
   an anode, a hole injection layer and a hole transport layer that are sequentially stacked between the base substrate and the quantum dot light emitting layer; and
   a cathode on a side of the electron transport layer away from the base substrate;
   wherein the built-in electric field comprises a third electric field between the hole transport layer and the quantum dot light emitting layer, and a fourth electric field between the electron transport layer and the quantum dot light emitting layer;
   a side of the third electric field close to the hole transport layer is a positive electrode, and a side of the third electric field close to the quantum dot light emitting layer is a negative electrode; and
   a side of the fourth electric field close to the electron transport layer is a positive electrode, and a side of the fourth electric field close to the quantum dot light emitting layer is a negative electrode.

5. The electroluminescent device according to claim 1, wherein the ionic complex layer comprises a cation moiety and an anion moiety, wherein:
   the cation moiety comprises a central metal ion and a ligand of the central metal ion, the central metal ion comprises one of Ir, La, Nd, Eu, Cu, In, Pb or Pt, and the ligand of the central metal ion comprises one of o-phenanthroline, 2-phenylpyridine, phenyloxadiazolepyridine, fluorophenylpyridine or bipyridine; and
   the anion moiety comprises one of tetrakis(pentafluorophenyl)boronic acid, tetrakis[(trifluoromethyl)phenyl]

boronic acid, tetrakis[bis(trifluoromethyl)phenyl]boronic acid, hexa(pentafluorophenyl)phosphoric acid, hexa[(trifluoromethyl)phenyl]phosphoric acid or hexa[bis(trifluoromethyl)phenyl]phosphoric acid.

6. The electroluminescent device according to claim 5, wherein the charge balance ion comprises a positive charge balance ion and a negative charge balance ion, wherein
the positive charge balance ion comprises the cation moiety, and the negative charge balance ion comprises the anion moiety.

7. The electroluminescent device according to claim 6, wherein:
the cation moiety is $NH_4^+$ or $Na^+$, and the anion moiety is $Cl^-$ or $PF^{6-}$.

8. A display substrate, comprising the electroluminescent device according to claim 1.

9. A display apparatus, comprising a display panel, wherein the display panel comprises the display substrate according to claim 8.

10. A method for manufacturing an electroluminescent device, comprising:
forming the electron transport layer and the quantum dot light emitting layer that are stacked, and forming the ionic complex layer between the electron transport layer and the quantum dot light emitting layer;
wherein the built-in electric field is formed in the ionic complex layer;
wherein the quantum dot light emitting layer comprises a quantum dot, a ligand and a charge balance ion;
wherein a group at one end, close to the quantum dot, of the ligand is connected with the quantum dot, a group, at another end, away from the quantum dot, of the ligand is an ionic complex of the ionic complex layer, and the ionic complex has charges with opposite polarity to chargers in the charge balance ion;
wherein a material of the ionic complex layer is an organic metal complex.

11. The method according to claim 10, comprising:
forming a cathode, the electron transport layer, the ionic complex layer which is independent, the quantum dot light emitting layer, a hole transport layer, a hole injection layer and an anode sequentially on a base substrate,
wherein the forming the ionic complex layer which independent comprises:
depositing a layer of an ionic complex thin film on the electron transport layer through a spin-coating or evaporation process;
applying an external electric field in a deposition process, aligning anions and cations inside the ionic complex thin film in an orientation through the external electric field to form the built-in electric field inside the ionic complex thin film, wherein the anions gathering on a side of the built-in electric field close to the electron transport layer forms a negative electrode and the cations gathering on a side of the built-in electric field close to the quantum dot light emitting layer forms a positive electrode; and
roasting the ionic complex thin film through a roasting process by continuously applying the external electric field or after removing the external electric field, so as to form the ionic complex layer which is independent.

12. The method according to claim 10, comprising forming a cathode, the electron transport layer, the ionic complex layer which is independent, the quantum dot light emitting layer, a hole transport layer, a hole injection layer and an anode sequentially on a base substrate, wherein
the forming the ionic complex layer comprises:
depositing a layer of an ionic complex thin film on the electron transport layer through a spin-coating or evaporation process; and
roasting the ionic complex thin film through a roasting process, applying an external electric field in the roasting process, aligning anions and cations inside the ionic complex thin film in an orientation through the external electric field to form the built-in electric field inside the ionic complex thin film, so as to form the ionic complex layer, wherein the anions gathering on a side of the built-in electric field close to the electron transport layer forms a negative electrode and the cations gathering on a side thereof close to the quantum dot light emitting layer forms a positive electrode.

13. The method according to claim 10, comprising:
forming a cathode and the electron transport layer sequentially on a base substrate;
forming a quantum dot mixed solution with the ionic complex, the quantum dot, the ligand, and the charge balance ion on the electron transport layer through a spin-coating or inkjet printing process;
solidifying the quantum dot mixed solution to form the quantum dot light emitting layer; and
forming a hole transport layer and a hole injection layer sequentially on the quantum dot light emitting layer;
wherein a first electric field is provided between the electron transport layer and the quantum dot light emitting layer, a side of the first electric field close to the electron transport layer is a negative electrode, and a side of the first electric field close to the quantum dot light emitting layer is a positive electrode; and a second electric field is provided between the hole transport layer and the quantum dot light emitting layer, and a side of the second electric field close to the hole transport layer is a negative electrode, and a side of the second electric field close to the quantum dot light emitting layer is a positive electrode.

14. The method according to claim 10, comprising:
forming an anode, a hole injection layer and a hole transport layer sequentially on a base substrate;
forming a quantum dot mixed solution with an ionic complex, a quantum dot, a ligand, and a charge balance ion on the hole transport layer through a spin-coating or inkjet printing process, wherein a group at one end, close to the quantum dot, of the ligand is connected with the quantum dot, a group at another end, away from the quantum dot, of the ligand is an ionic complex, and the ionic complex has charges with opposite polarity to chargers in the charge balance ion;
solidifying the quantum dot mixed solution to form the quantum dot light emitting layer; and
forming the electron transport layer and a cathode sequentially on the quantum dot light emitting layer;
wherein a third electric field is provided between the hole transport layer and the quantum dot light emitting layer, a side of the third electric field close to the hole transport layer is a positive electrode, and a side of the third electric field close to the quantum dot light emitting layer is a negative electrode; and a fourth electric field is provided between the electron transport layer and the quantum dot light emitting layer, a side of the fourth electric field close to the electron transport layer is a positive electrode, and a side of the fourth electric field close to the quantum dot light emitting layer is a negative electrode.

* * * * *

UNITED STATES PATENT AND TRADEMARK OFFICE
CERTIFICATE OF CORRECTION

| | | |
|---|---|---|
| PATENT NO. | : 12,279,470 B2 | Page 1 of 1 |
| APPLICATION NO. | : 17/764425 | |
| DATED | : April 15, 2025 | |
| INVENTOR(S) | : Dong Li | |

It is certified that error appears in the above-identified patent and that said Letters Patent is hereby corrected as shown below:

On the Title Page

Item (30) should read:
Foreign Application Priority Data
Jun. 17, 2020 (CN) .............................. 202010555558.1

Signed and Sealed this
Twentieth Day of May, 2025

Coke Morgan Stewart
*Acting Director of the United States Patent and Trademark Office*